(12) United States Patent
Peng

(10) Patent No.: US 11,522,148 B2
(45) Date of Patent: Dec. 6, 2022

(54) DISPLAY PANEL HAVING QUANTUM DOT LIGHT SCATTERING PARTICLE COMPOSITE AND MANUFACTURING METHOD THEREOF

(71) Applicant: Shenzhen China Star Optoelectronics Semiconductor Display Technology Co., Ltd., Guangdong (CN)

(72) Inventor: Wenxiang Peng, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 146 days.

(21) Appl. No.: 16/981,729

(22) PCT Filed: May 21, 2020

(86) PCT No.: PCT/CN2020/091575
§ 371 (c)(1),
(2) Date: Sep. 17, 2020

(87) PCT Pub. No.: WO2021/227121
PCT Pub. Date: Nov. 18, 2021

(65) Prior Publication Data
US 2021/0351369 A1 Nov. 11, 2021

(30) Foreign Application Priority Data
May 11, 2020 (CN) .......................... 202010392054.2

(51) Int. Cl.
*H01L 51/50* (2006.01)
*H01L 27/32* (2006.01)
(Continued)

(52) U.S. Cl.
CPC .......... *H01L 51/502* (2013.01); *H01L 27/322* (2013.01); *H01L 51/5268* (2013.01); *H01L 51/56* (2013.01)

(58) Field of Classification Search
CPC combination set(s) only.
See application file for complete search history.

(56) References Cited

U.S. PATENT DOCUMENTS

| 2018/0083158 A1* | 3/2018 | Jang ...................... G02F 1/0045 |
| 2018/0102449 A1 | 4/2018 | Pschenitzka et al. |

(Continued)

FOREIGN PATENT DOCUMENTS

| CN | 103917000 | 7/2014 |
| CN | 106833649 | 6/2017 |

(Continued)

*Primary Examiner* — Nduka E Ojeh
(74) *Attorney, Agent, or Firm* — PV IP PC; Wei Te Chung; Ude Lu

(57) ABSTRACT

The present application provides a display panel and a manufacturing method thereof. Quantum dot ink is prepared by dispersing a quantum dot light scattering particle composite in a dispersion medium. The quantum dot light scattering particle composite includes light scattering particles and oil phase quantum dots attached to surfaces of the light scattering particles. Oil solubility of the oil phase quantum dots is used to increase dispersion stability of the light scattering particles in the dispersion medium to satisfy process requirements of inkjet printing.

16 Claims, 2 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 2018/0105658 A1* | 4/2018 | Cho | G02F 1/133603 |
| 2020/0266371 A1* | 8/2020 | Ju | H01L 51/502 |
| 2021/0376242 A1* | 12/2021 | Lee | H01L 51/009 |

FOREIGN PATENT DOCUMENTS

| | | |
|---|---|---|
| CN | 107238973 | 10/2017 |
| CN | 109535836 | 3/2019 |
| CN | 110275351 | 9/2019 |
| CN | 110335933 | 10/2019 |
| CN | 110643349 | 1/2020 |
| CN | 110989296 | 4/2020 |

* cited by examiner

DISPLAY PANEL HAVING QUANTUM DOT LIGHT SCATTERING PARTICLE COMPOSITE AND MANUFACTURING METHOD THEREOF

RELATED APPLICATIONS

This application is a National Phase of PCT Patent Application No. PCT/CN2020/091575 having International filing date of May 21, 2020, which claims the benefit of priority of Chinese Patent Application No. 202010392054.2 filed on May 11, 2020. The contents of the above applications are all incorporated by reference as if fully set forth herein in their entirety.

FIELD AND BACKGROUND OF THE INVENTION

The present application is related to the field of display technology, and specifically, to a display panel and a manufacturing method thereof.

A quantum dot light-emitting diode (QD-LED) display is composed of two parts: a quantum dot color filter (QDCF) and diodes as blue light backlight source, which not only have characteristics of light-emitting diode devices such as self-luminosity, as well as being thin and flexible, but also have an advantage of having wide color gamut of quantum dots. The QD-LED display uses photoluminescence characteristics of quantum dots (QDs) in the quantum dot color filter to convert the blue light of the backlight source into red and green light, thereby achieving a purpose of full-color display.

Common red light and green light quantum dot inks are usually added with some scattering particles (e.g., $TiO_2$) to increase an optical path length of excited light in film layers to increase brightness conversion efficiency of the quantum dots in the ink. $TiO_2$ has a good scattering effect, but it cannot be well dispersed in traditional acrylic inks and will slowly agglomerate and block nozzles of inkjet printers, thereby adversely affecting subsequent printing process.

SUMMARY OF THE INVENTION

A purpose of the present application is to provide a display panel and a manufacturing method thereof, so as to solve problems that light scattering particles cannot be stably dispersed in traditional ink during a manufacturing process of the display panel.

In order to achieve the above purpose, the present application provides a manufacturing method of a display panel, and the manufacturing method includes following steps:

forming quantum dot ink on a first substrate followed by curing to obtain the first substrate provided with a quantum dot light conversion layer, wherein the quantum dot ink includes a dispersion medium and a quantum dot light scattering particle composite dispersed in the dispersion medium, the quantum dot light scattering particle composite includes light scattering particles and oil phase quantum dots attached to surfaces of the light scattering particles, and the quantum dot light conversion layer is configured to receive and be excited by blue light to emit at least red light and green light; and disposing a surface of a second substrate provided with a blue light emitting layer opposite to a surface of the first substrate provided with the quantum dot light conversion layer to obtain the display panel.

In the above manufacturing method of the display panel, a preparation method of the quantum dot light scattering particle composite includes following steps:

dispersing the oil phase quantum dots in a lipophilic solvent to obtain an oil phase quantum dot solution; and mixing the light scattering particles into the oil phase quantum dot solution and removing the lipophilic solvent after standing to obtain the quantum dot light scattering particle composite, wherein material of the light scattering particles is selected from at least one of titanium dioxide or silicon oxide.

In the above manufacturing method of the display panel, a preparation method of the oil phase quantum dots includes following steps:

dispersing an oil phase quantum dot stock solution in the lipophilic solvent to obtain a solvent of the oil phase quantum dot stock solution, wherein the oil phase quantum dot stock solution includes original oil phase quantum dots, and the original oil phase quantum dots include quantum dots and organic ligands attached on surfaces of the quantum dots; and washing away part of the organic ligands in the original oil phase quantum dots by adding a precipitant to the solvent of the oil phase quantum dot stock solution, and obtaining the oil phase quantum dots by centrifuging and separating.

In the above manufacturing method of the display panel, the lipophilic solvent is cyclohexane, and the precipitant is an alcohol solvent.

In the above manufacturing method of the display panel, the precipitant is ethanol.

In the above manufacturing method of the display panel, the organic ligands are selected from at least one of oleic acid, trioctylphosphine, oleylamine, or dodecanethiol.

In the above manufacturing method of the display panel, a mass percentage of the quantum dot light scattering particle composite and the dispersion medium is (1%-5%):(95%-99%). The dispersion medium includes monomers, photoinitiators, and an organic solvent.

In the above manufacturing method of the display panel, a particle diameter of each of the light scattering particles is greater than 10 nanometers and less than or equal to 50 nanometers.

In the above manufacturing method of the display panel, the blue light emitting layer is selected from at least one of a blue organic light emitting diode, a blue micro light emitting diode, or a blue sub-millimeter light emitting diode.

A display panel, including a first substrate, a quantum dot light conversion layer, a second substrate, and a blue light emitting layer.

The first substrate is opposite to the second substrate.

The quantum dot light conversion layer is disposed on a surface of the first substrate opposite to the second substrate. The quantum dot light conversion layer includes a quantum dot light scattering particle composite. The quantum dot light scattering particle composite includes light scattering particles and oil phase quantum dots attached to surfaces of the light scattering particles. The quantum dot light conversion layer is configured to receive and be excited by blue light to emit at least red light and green light.

The blue light emitting layer is disposed on a surface of the second substrate opposite to the first substrate.

The blue light emitting layer is configured to emit blue light.

In the above display panel, the quantum dot light conversion layer includes a red light quantum dot light conversion unit, a green light quantum dot light conversion unit, and a blue light diffusion unit.

The red light quantum dot light conversion unit includes the light scattering particles and oil phase red light quantum dots attached to the surfaces of the light scattering particles.

The green light quantum dot light conversion unit includes the light scattering particles and oil phase green light quantum dots attached to the surfaces of the light scattering particles.

The blue light diffusion unit includes organic silicon scattering particles.

Material of the light scattering particles is selected from at least one of titanium dioxide or silicon oxide.

In the above display panel, a particle diameter of each of the light scattering particles is greater than 10 nanometers and less than or equal to 50 nanometers.

In the above display panel, the display panel further includes a color filter layer disposed between the first substrate and the quantum dot light conversion layer.

In the above display panel, the display panel further includes a dielectric layer disposed between the color filter layer and the quantum dot light conversion layer.

In the above display panel, the dielectric layer includes a silicon dioxide layer.

In the above display panel, the blue light emitting layer is selected from at least one of a blue organic light emitting diode, a blue micro light emitting diode, or a blue sub-millimeter light emitting diode.

The present application provides the display panel and the manufacturing method thereof. The quantum dot ink is prepared by dispersing the quantum dot light scattering particle composite in the dispersion medium. The quantum dot light scattering particle composite includes the light scattering particles and the oil phase quantum dots attached to the surfaces of the light scattering particles. Oil solubility of the oil phase quantum dots is used to increase dispersion stability of the light scattering particles in the dispersion medium to satisfy process requirements of inkjet printing. In addition, because the quantum dot light conversion layer includes the light scattering particles, the quantum dot light conversion layer has a refracting and scattering effect on the blue light emitted by the blue light emitting layer, thereby increasing an optical path length of the blue light in the quantum dot light conversion layer and ultimately increasing brightness conversion efficiency of the quantum dot light conversion layer.

DESCRIPTION OF SPECIFIC EMBODIMENTS OF THE INVENTION

To further explain the technical means and effect of the present application, the following refers to embodiments and drawings for detailed description. Obviously, the described embodiments are only for some embodiments of the present application, instead of all embodiments. All other embodiments based on embodiments in the present application and obtained by those skilled in the art without creative efforts are within the scope of the present application.

Figure 1:
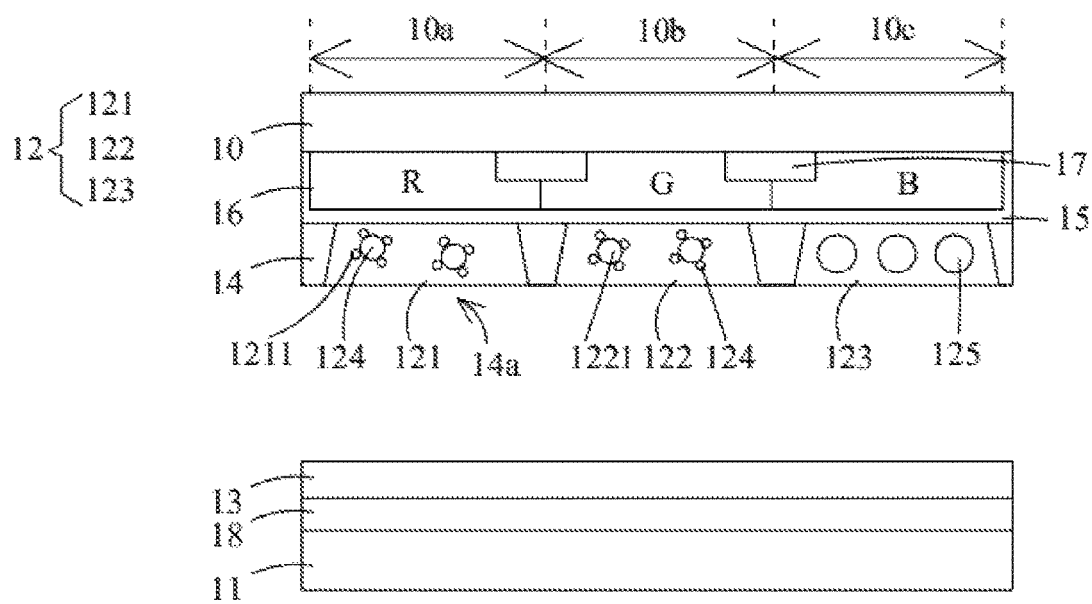
FIG. 1 is a structural diagram of a display panel of an embodiment of the present application.

Please refer to FIG. 1, which is a structural diagram of a display panel of an embodiment of the present application. The display panel 100 includes a first substrate 10, a quantum dot light conversion layer 12, a second substrate 11, a blue light emitting layer 13, a pixel defining layer 14, a dielectric layer 15, a color filter layer 16, a black matrix layer 17, and a thin-film transistor array layer 18.

The first substrate 10 is opposite to the second substrate 11. Both the first substrate 10 and the second substrate 11 are glass substrates.

The quantum dot light conversion layer 12 is configured to receive and be excited by blue light to emit at least red light and green light. The quantum dot light conversion layer 12 is disposed on a surface of the first substrate 10 opposite to the second substrate 11. The quantum dot light conversion layer 12 includes a quantum dot light scattering particle composite. The quantum dot light scattering particle composite includes light scattering particles and oil phase quantum dots attached to surfaces of the light scattering particles.

The light scattering particles are hydrophilic scattering particles. Material of the light scattering particles is selected from at least one of titanium dioxide or silicon oxide. Understandably, the light scattering particles can also be organic silicone scattering particles. Specifically, the light scattering particles are titanium dioxide scattering particles. A particle diameter of each of the light scattering particles is greater than 10 nanometers and less than or equal to 50 nanometers.

The oil phase quantum dots include quantum dots and organic ligands attached on surfaces of the quantum dots. A particle diameter of the quantum dots is greater than or equal to 1 nanometer and less than or equal to 10 nanometers. The organic ligands are long-chain organic ligands, such as oleic acid, trioctylphosphine, oleylamine, and dodecanethiol.

Specifically, the quantum dot light conversion layer 12 includes a red light quantum dot light conversion unit 121, a green light quantum dot light conversion unit 122, and a blue light diffusion unit 123. The red light quantum dot light conversion unit 121, the green light quantum dot light conversion unit 122, and the blue light diffusion unit 123 are disposed in sequence.

The red light quantum dot light conversion unit 121 includes light scattering particles 124 and oil phase red light quantum dots 1211 attached to the surfaces of the light scattering particles 124. The red light quantum dot light conversion unit 121 is configured to receive the blue light emitted by the blue light emitting layer 13. The blue light is incident on the oil phase red light quantum dots 1211, and the red light quantum dots are excited and emit red light after receiving the blue light. An optical path length of the blue light in the red light quantum dot light conversion unit 121 is increased, thereby increasing the brightness conversion efficiency of the red light quantum dot light conversion unit 121. The red light quantum dots can be CdSe—CdS—ZnS, where CdSe is a core, a particle diameter of CdSe is 5 nanometers, and both CdS and ZnS are shells.

The green light quantum dot light conversion unit 122 includes the light scattering particles 124 and oil phase green light quantum dots 1221 attached to the surfaces of the light scattering particles 124. The green light quantum dot light conversion unit 122 is configured to receive the blue light emitted by the blue light emitting layer 13. The blue light is incident on the oil phase green light quantum dots 1221, and the green light quantum dots are excited and emit green light after receiving the blue light. An optical path length of the blue light in the green light quantum dot light conversion unit 122 is increased, thereby increasing the brightness conversion efficiency of the green light quantum dot light conversion unit 122. The green light quantum dots can be CdSe—CdS—ZnS, where CdSe is a core, a particle diameter of CdSe is 3 nanometers, and both CdS and ZnS are shells.

The blue light diffusion unit 123 includes organic silicon scattering particles 125. After the blue light emitted by the blue light emitting layer 13 is incident on the blue light diffusion layer 123, the organic silicone scattering particles 125 scatter the blue light to increase viewing angles of blue subpixels.

The blue light emitting layer 13 is configured to emit the blue light. The blue light emitting layer 13 is disposed on a surface of the second substrate 11 opposite to the first substrate 10. The blue light emitting layer 13 is selected from at least one of a blue organic light emitting diode (blue OLED), a blue micro light emitting diode (blue micro-LED), or a blue sub-millimeter light emitting diode (blue mini-LED).

The thin-film transistor array layer 18 includes a plurality of thin-film transistors arranged in an array. The thin-film transistors are configured to control a working state of the blue light emitting layer 13. The thin-film transistor array layer 18 is disposed between the blue light emitting layer 13 and the second substrate 11.

The color filter layer 16 is disposed between the first substrate 10 and the quantum dot light conversion layer 12. The color filter layer 16 includes a plurality of filter units. The plurality of filter units includes a red filter unit R, a blue filter unit B, and a green filter unit G. The black matrix layer 17 includes a plurality of black matrices, and a black matrix is provided between two adjacent filter units. The red filter unit R, the green filter unit G and the blue filter unit B are repeatedly arranged in sequence. The red filter unit R is disposed corresponding to the red light quantum dot light conversion unit 121, the green filter unit G is disposed corresponding to the green light quantum dot light conversion unit 122, and the blue filter unit B is disposed corresponding to the blue light diffusion layer 123. The color filter layer 16 is configured to filter the blue light which is not completely absorbed by the red quantum dot light conversion unit 121 and the green quantum dot light conversion unit 122 and to block external light to reduce excitation of the quantum dots by natural light. A main function of the black matrix layer 17 is to prevent optical crosstalk.

The dielectric layer 15 is formed on a surface of the color filter layer 16 away from the first substrate 10 and is disposed between the color filter layer 16 and the quantum dot light conversion layer 12. The dielectric layer 15 is configured to enhance a contact effect with film layers of 121, 122, and 123 and prevent peeling of quantum dot film layers due to differences in film quality. The dielectric layer includes a silicon dioxide ($SiO_2$) layer.

The pixel definition layer 14 is configured to define subpixel regions. The subpixel regions include a red subpixel region 10a, a blue subpixel region 10c, and a green subpixel region 10b. The red subpixel region 10a, the blue subpixel region 10c, and the green subpixel region 10b are disposed in sequence. The pixel defining layer 14 is disposed on a surface of the dielectric layer 15 away from the color filter layer 16. The pixel defining layer 14 is provided with a plurality of openings 14a, and the quantum dot light conversion layer 12 is formed in the openings 14a. The pixel defining layer 14 is a black organic layer. The red light quantum dot light conversion unit 121 is obtained by printing red light quantum dot ink into the opening 14a corresponding to the red subpixel region, which is followed by curing. The red light quantum dot ink includes a dispersion medium and a red light quantum dot light scattering particle composite dispersed in the dispersion medium. The red light quantum dot light scattering particle composite includes the light scattering particles and the oil phase red light quantum dots attached to the surfaces of the light scattering particles. The red light quantum dot ink can also include the oil phase red light quantum dots dispersed in the dispersion medium. The green light quantum dot light conversion unit 122 is obtained by printing green light quantum dot ink into the opening 14a corresponding to the green subpixel region, which is followed by curing. The green light quantum dot ink includes the dispersion medium and a green light quantum dot light scattering particle composite dispersed in the dispersion medium. The green light quantum dot light scattering particle composite includes the light scattering particles and the oil phase green light quantum dots attached to the surfaces of the light scattering particles. The green light quantum dot ink can also include the oil phase green light quantum dots dispersed in the dispersion medium. The blue light diffusion unit 123 is obtained by printing a mixture of the organic silicone scattering particles and the dispersion medium into the opening 14a corresponding to the blue subpixel, which is followed by curing. Because organic silicone is an organic substance, which has good dispersibility and stability in the dispersion medium. A particle diameter of the silicone scattering particles is greater than 10 nanometers and less than 50 nanometers; for example, the particle diameter of the silicone scattering particles is 30 nanometers.

The dispersion medium includes monomers, photoinitiators, and an organic solvent. In terms of a mass percentage, the mass percentage of the monomers, the photoinitiator, and the organic solvent is (79%-99%):1%:(0-20%). The monomers are acrylates and their derivatives. The photoinitiators are at least one of benzyl, their derivatives, benzophenone, dialkoxyacetophenones, α-hydroxyalkyl phenones, or α-aminoalkyl aryl ketones. The organic solvent is ethyl acetate. The photoinitiators decompose under an action of ultraviolet light to generate active free radicals, and the active free radicals initiate polymerization and curing of the monomers.

In the display panel of the present application, the quantum dot light scattering particle composite includes the light scattering particles and the oil phase quantum dots attached to the surfaces of the light scattering particles. Oil solubility of the oil phase quantum dots is used to increase dispersion stability of the light scattering particles in the dispersion medium to satisfy process requirements of inkjet printing. In addition, attachments of the oil-phase quantum dots to the surfaces of the light-scattering quantum dots further increases utilization of the quantum dots to refract the light scattering particles and scatter the blue light.

Figure 2:
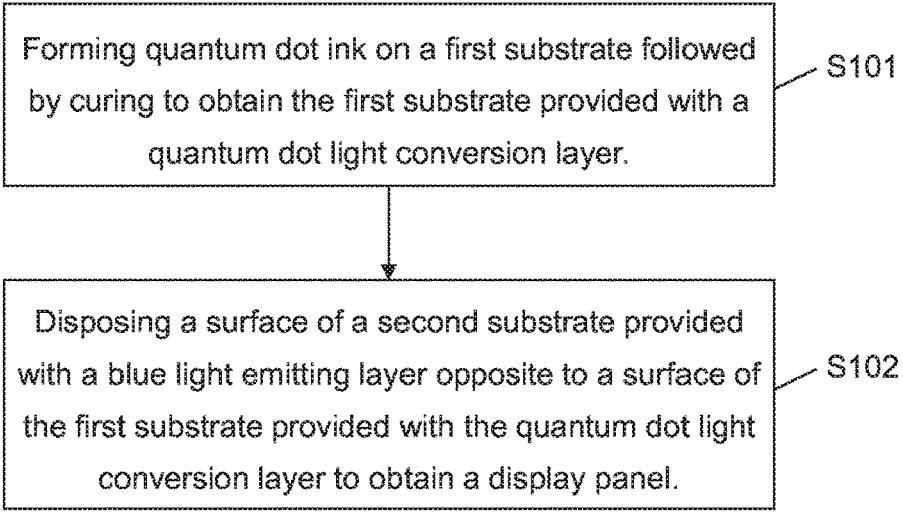
FIG. 2 is a flowchart of a manufacturing method of the display panel of an embodiment of the present application.

Please refer to FIG. 2, which is a flowchart of a manufacturing method of the display panel of an embodiment of the present application. The manufacturing method of the display panel includes following steps:

S101: forming the quantum dot ink on the first substrate followed by curing to obtain the first substrate provided with the quantum dot light conversion layer.

Specifically, the first substrate includes the pixel defining layer, the pixel defining layer is provided with a plurality of openings, and each of the plurality of openings corresponding to a subpixel groove. The plurality of openings include a red light subpixel groove, a green light subpixel groove, and a blue light subpixel groove. The red light subpixel groove, the green light subpixel groove, and the blue light subpixel groove are repeatedly disposed in sequence. The red light quantum dot ink is printed in the red light subpixel groove by inkjet printing technology, and the red light quantum dot light conversion unit is cured by the ultraviolet light. The red light quantum dot ink includes the dispersion medium and the red light quantum dot light scattering particle composite dispersed in the dispersion medium. The red light quantum dot light scattering particle composite includes the light scattering particles and the oil phase red light quantum dots attached to the surfaces of the light scattering particles. The red light quantum dot ink can also include the oil phase red light quantum dots dispersed in the dispersion medium. The green light quantum dot ink is printed in the green light subpixel groove by inkjet printing technology, and the green light quantum dot light conversion unit is cured by the ultraviolet light. The green light quantum dot ink includes the dispersion medium and the green light quantum dot light scattering particle composite dispersed in the dispersion medium. The green light quantum dot light scattering particle composite includes the light scattering particles and the oil phase green light quantum dots attached to the surfaces of the light scattering particles. The green light quantum dot ink can also include the oil phase green light quantum dots dispersed in the dispersion medium. The organic silicone scattering particles and the dispersion medium is printed in the blue light subpixel groove by inkjet printing technology, and the blue light diffusion unit is obtained after curing. The red light quantum dot light conversion unit, the green light quantum dot light conversion unit, and the blue light diffusion unit form the quantum dot light conversion layer. The pixel defining layer is a black organic layer.

S102: disposing a surface of the second substrate provided with the blue light emitting layer opposite to a surface of the first substrate provided with the quantum dot light conversion layer to obtain the display panel.

Specifically, a surface of the second substrate provided with the blue light emitting layer is opposite to a surface of the first substrate provided with the quantum dot light conversion layer. After the blue light emitted from the blue light emitting layer enters the quantum dot light conversion layer, the blue light incident on the red light quantum dot light conversion unit excites the red light quantum dots to emit red light. Because the red quantum dot light conversion unit includes the light scattering particles, the optical path length of the blue light in the red quantum dot light conversion unit is increased, and conversion efficiency of the blue light excited red light quantum dots to generate red light is increased. After the blue light emitted from the blue light emitting layer enters the quantum dot light conversion layer, the blue light incident on the green light quantum dot light conversion unit excites the green light quantum dots to emit green light. Because the green quantum dot light conversion unit includes the light scattering particles, the optical path length of the blue light in the green quantum dot light conversion unit is increased, and conversion efficiency of the blue light excited green light quantum dots to generate green light is increased. After the blue light emitted from the blue light emitting layer is scattered by the organic silicone scattering particles, the viewing angles of the blue subpixel are increased.

In this embodiment, a preparation method of the quantum dot light scattering particle composite includes following steps:

dispersing the oil phase quantum dots in a lipophilic solvent to obtain an oil phase quantum dot solution; and mixing the light scattering particles into the oil phase quantum dot solution and removing the lipophilic solvent after standing to obtain the quantum dot light scattering particle composite, wherein material of the light scattering particles is selected from at least one of titanium dioxide or silicon oxide.

Van der Waals forces between the quantum dots and the light scattering particles in the oil phase quantum dots is used to make the oil phase quantum dots adhere to the surfaces of the light scattering particles, thereby obtaining the quantum dot light scattering particle composite.

In this embodiment, the particle diameter of each of the light scattering particles is greater than 10 nanometers and less than or equal to 50 nanometers. Specifically, the particle diameter of each of the light scattering particles is 25 nanometers.

In this embodiment, a preparation method of the oil phase quantum dots includes following steps:

dispersing an oil phase quantum dot stock solution in the lipophilic solvent to obtain a solvent of the oil phase quantum dot stock solution, wherein the oil phase quantum dot stock solution includes original oil phase quantum dots, and the original oil phase quantum dots include quantum dots and organic ligands attached on surfaces of the quantum dots; and washing away part of the organic ligands in the original oil phase quantum dots by adding a precipitant to the solvent of the oil phase quantum dot stock solution, and obtaining the oil phase quantum dots by centrifuging and separating.

By dispersing an oil phase quantum dot stock solution in the lipophilic solvent and washing away part of the organic ligands in the original oil phase quantum dots by the precipitant, the organic ligands attached to the surfaces of the oil phase quantum dots are less than those attached to the surfaces of the original oil phase quantum dots. On one hand, resistance of the organic ligands to the oil phase quantum dots attached to the surfaces of the light scattering particles is reduced. On the other hand, the remaining organic ligands ensure that the oil phase quantum dots can be well dispersed in traditional ink.

In this embodiment, the lipophilic solvent is cyclohexane, the precipitant is an alcohol solvent. The alcohol solvent includes ethanol, propanol, and ethylene glycol. Specifically, the alcohol solvent is ethanol.

In this embodiment, a mass percentage of the quantum dot light scattering particle composite and the dispersion medium is (1%-5%):(95%-99%). The dispersion medium includes monomers, photoinitiators, and an organic solvent.

The above solutions are described in detail below in conjunction with specific embodiments.

First Embodiment

This embodiment provides the red light quantum dot ink, including following steps:

adding commercially available 5 mL of oil phase red light quantum dot stock solution (purchased from Suzhou Xingshuo Nanotech Co., Ltd., product No.: CdSe-625-25) to 15 mL of cyclohexane and stirring to obtain a solvent of the oil phase red light quantum dot stock solution, wherein the oil phase red light quantum dot stock solution includes original oil phase red light quantum dots, the original oil phase red light quantum dots include the red light quantum dots and the organic ligands attached to the surfaces of the red light quantum dots;

adding 60 mL of ethanol to the solvent of the oil phase red light quantum dot stock solution to wash away part of the organic ligands on the surfaces of the original oil phase red light quantum dots and centrifuging at 3000 r/min for 4 minutes followed by separating to obtain the oil phase red light quantum dots from sediments on a bottom layer;

adding the oil phase red light quantum dots to 15 mL of cyclohexane followed by stirring, mixing with P25 ($TiO_2$, particle diameter of 25 nanometers) followed by resting, and removing the cyclohexane to obtain the red light quantum dot light scattering particle composite; and mixing the red light quantum dot light scattering particle composite and ink (80 wt % acrylate, 1 wt % benzophenone, and 19 wt % ethyl acetate) at a mass percentage of 3%:97% to obtain the red light quantum dot ink.

Second Embodiment

This embodiment provides the green light quantum dot ink, including following steps:

adding commercially available 4 mL of oil phase green light quantum dot stock solution (purchased from Suzhou Xingshuo Nanotech Co., Ltd., product No.: CdSe-525-25) to 12 mL of cyclohexane and stirring to obtain a solvent of the oil phase green light quantum dot stock solution, wherein the oil phase green light quantum dot stock solution includes original oil phase green light quantum dots, the original oil phase green light quantum dots include the green light quantum dots and the organic ligands attached to the surfaces of the green light quantum dots;

adding 50 mL of ethanol to the solvent of the oil phase green light quantum dot stock solution to wash away part of the organic ligands on the surfaces of the original oil phase green light quantum dots and centrifuging at 5000 r/min for 5 minutes followed by separating to obtain the oil phase green light quantum dots from sediments on a bottom layer;

adding the oil phase green light quantum dots to 15 mL of cyclohexane followed by stirring, mixing with P25 ($TiO_2$, particle diameter of 25 nanometers) followed by resting, and removing the cyclohexane to obtain the green light quantum dot light scattering particle composite; and mixing the green light quantum dot light scattering particle composite and the ink (80 wt % acrylate, 1 wt % benzophenone, and 19 wt % ethyl acetate) at a mass percentage of 5%:95% to obtain the green light quantum dot ink.

Third Embodiment

Figure 3:
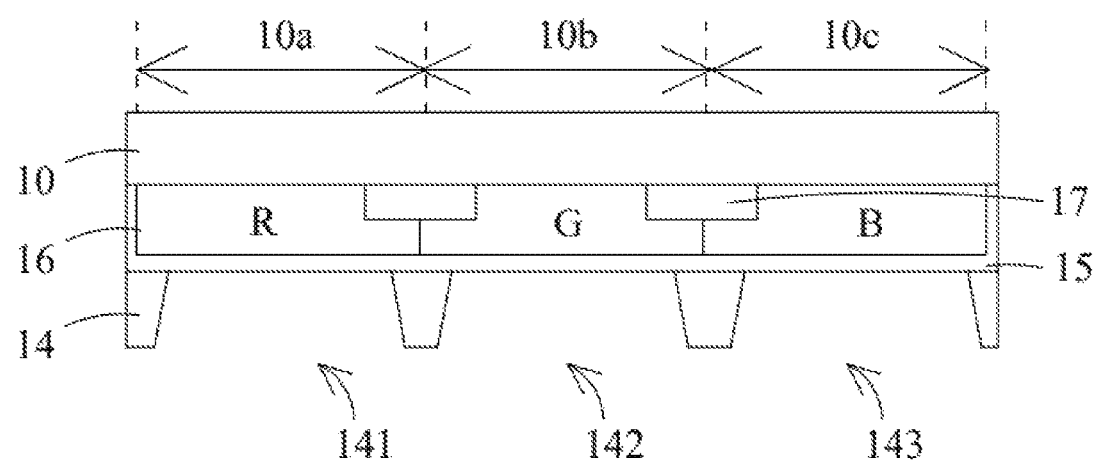
FIG. 3 is a structural diagram of a substrate provided with a red light subpixel groove, a green light subpixel groove, and a blue light subpixel groove.

This embodiment provides the display panel. The manufacturing method of the display panel includes following steps:

providing the red light subpixel groove 141, the green light subpixel groove 142, and the blue light subpixel groove 143 as shown in FIG. 3;

printing the red light quantum ink prepared in the first embodiment into the red light subpixel groove 141 of the substrate by inkjet printing and curing by ultraviolet light irradiation to obtain the red light quantum dot light conversion unit;

printing the green light quantum ink prepared in the second embodiment into the green light subpixel groove 142 of the substrate by inkjet printing and curing by the ultraviolet light irradiation to obtain the green light quantum dot light conversion unit;

printing a mixture of 3 grams of the organic silicone scattering particles (particle diameter of 30 nanometers) and 97 grams of the ink (80 wt % acrylate, 1 wt % benzophenone, and 19 wt % ethyl acetate) into the blue light subpixel groove 143 and curing by the ultraviolet light irradiation to obtain the blue light diffusion unit; and disposing the substrate formed with the red light quantum dot light conversion unit, the green light quantum dot light conversion unit, and the blue light diffusion unit opposite to the substrate with a blue organic light-emitting diode layer to obtain the display panel.

It should be explained that the substrate shown in FIG. 3 is same as the first substrate shown in FIG. 1 provided with the color filter layer, the black matrices, the dielectric layer, and the pixel defining layer, which is not described herein.

The description of the above embodiments is only for helping to understand technical solutions and core ideas of the present application; persons of ordinary skill in the art should understand that they may still make modifications to the technical solutions described in the above embodiments or make equivalent replacements to some or all technical features thereof, without departing from the scope of the technical solutions of the embodiments of the present application.

What is claimed is:

1. A manufacturing method of a display panel, comprising following steps:
    forming quantum dot ink on a first substrate followed by curing to obtain the first substrate provided with a quantum dot light conversion layer, wherein the quantum dot ink comprises a dispersion medium and a quantum dot light scattering particle composite dispersed in the dispersion medium, the quantum dot light scattering particle composite comprises light scattering particles and oil phase quantum dots attached to surfaces of the light scattering particles, and the quantum dot light conversion layer is configured to receive and be excited by blue light to emit at least red light and green light; and
    disposing a surface of a second substrate provided with a blue light emitting layer opposite to a surface of the first substrate provided with the quantum dot light conversion layer to obtain the display panel.

2. The manufacturing method of the display panel according to claim 1, wherein a preparation method of the quantum dot light scattering particle composite comprises following steps:
    dispersing the oil phase quantum dots in a lipophilic solvent to obtain an oil phase quantum dot solution; and
    mixing the light scattering particles into the oil phase quantum dot solution and removing the lipophilic solvent after standing to obtain the quantum dot light scattering particle composite, wherein material of the light scattering particles is selected from at least one of titanium dioxide or silicon oxide.

3. The manufacturing method of the display panel according to claim 2, wherein a preparation method of the oil phase quantum dots comprises following steps:
    dispersing an oil phase quantum dot stock solution in the lipophilic solvent to obtain a solvent of the oil phase quantum dot stock solution, wherein the oil phase quantum dot stock solution comprises original oil phase quantum dots, and the original oil phase quantum dots comprise quantum dots and organic ligands attached on surfaces of the quantum dots; and
    washing away part of the organic ligands in the original oil phase quantum dots by adding a precipitant to the solvent of the oil phase quantum dot stock solution, and obtaining the oil phase quantum dots by centrifuging and separating.

4. The manufacturing method of the display panel according to claim 3, wherein the lipophilic solvent is cyclohexane, and the precipitant is an alcohol solvent.

5. The manufacturing method of the display panel according to claim 4, wherein the precipitant is ethanol.

6. The manufacturing method of the display panel according to claim 3, wherein the organic ligands are selected from at least one of oleic acid, trioctylphosphine, oleylamine, or dodecanethiol.

7. The manufacturing method of the display panel according to claim 1, wherein a mass percentage of the quantum dot light scattering particle composite and the dispersion medium is (1%-5%):(95%-99%), and the dispersion medium comprises monomers, photoinitiators, and an organic solvent.

8. The manufacturing method of the display panel according to claim 1, wherein a particle diameter of each of the light scattering particles is greater than 10 nanometers and less than or equal to 50 nanometers.

9. The manufacturing method of the display panel according to claim 1, wherein the blue light emitting layer is selected from at least one of a blue organic light emitting diode, a blue micro light emitting diode, or a blue sub-millimeter light emitting diode.

10. A display panel, comprising a first substrate, a quantum dot light conversion layer, a second substrate, and a blue light emitting layer;
   wherein the first substrate is opposite to the second substrate;
   wherein the quantum dot light conversion layer is disposed on a surface of the first substrate opposite to the second substrate, the quantum dot light conversion layer comprises a quantum dot light scattering particle composite, the quantum dot light scattering particle composite comprises light scattering particles and oil phase quantum dots attached to surfaces of the light scattering particles, and the quantum dot light conversion layer is configured to receive and be excited by blue light to emit at least red light and green light;
   wherein the blue light emitting layer is disposed on a surface of the second substrate opposite to the first substrate; and
   wherein the blue light emitting layer is configured to emit blue light.

11. The display panel according to claim 10, wherein the quantum dot light conversion layer comprises a red light quantum dot light conversion unit, a green light quantum dot light conversion unit, and a blue light diffusion unit;
   the red light quantum dot light conversion unit comprises the light scattering particles and oil phase red light quantum dots attached to the surfaces of the light scattering particles;
   the green light quantum dot light conversion unit comprises the light scattering particles and oil phase green light quantum dots attached to the surfaces of the light scattering particles;
   the blue light diffusion unit comprises organic silicon scattering particles; and
   material of the light scattering particles is selected from at least one of titanium dioxide or silicon oxide.

12. The display panel according to claim 10, wherein a particle diameter of each of the light scattering particles is greater than 10 nanometers and less than or equal to 50 nanometers.

13. The display panel according to claim 10, further comprising a color filter layer disposed between the first substrate and the quantum dot light conversion layer.

14. The display panel according to claim 13, further comprising a dielectric layer disposed between the color filter layer and the quantum dot light conversion layer.

15. The display panel according to claim 14, wherein the dielectric layer comprises a silicon dioxide layer.

16. The display panel according to claim 10, wherein the blue light emitting layer is selected from at least one of a blue organic light emitting diode, a blue micro light emitting diode, or a blue sub-millimeter light emitting diode.

* * * * *